(12) United States Patent
Lee et al.

(10) Patent No.: US 8,003,447 B2
(45) Date of Patent: Aug. 23, 2011

(54) MULTI-CHIP MODULE FOR BATTERY POWER CONTROL

(75) Inventors: Jeongil Lee, Seoul (KR); Myoungho Lee, Kyounggi-do (KR); Bigildis Dosdos, San Jose, CA (US); Charles Suico, Milpitas, CA (US); Edwin Man Fai Lee, Shatin (HK); David Chong Sook Lim, Penang (MY); Adriano M. Vilas-Boas, Campbell, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/964,691

(22) Filed: Dec. 9, 2010

(65) Prior Publication Data
US 2011/0078899 A1   Apr. 7, 2011

Related U.S. Application Data

(62) Division of application No. 11/672,728, filed on Feb. 8, 2007, now Pat. No. 7,868,432.

(60) Provisional application No. 60/773,034, filed on Feb. 13, 2006.

(51) Int. Cl.
*H01L 23/495* (2006.01)

(52) U.S. Cl. ........ 438/123; 438/124; 438/106; 257/666; 257/676; 257/670; 257/675; 257/E23.031; 257/E23.059; 257/733; 257/787; 257/796; 257/E23.001

(58) Field of Classification Search .................. 438/123, 438/124, 106; 257/666, 677, 676, 675, E23.031, 257/E23.059, 733, 787, 796, E23.194, E23.001
See application file for complete search history.

(56) References Cited

U.S. PATENT DOCUMENTS

| 7,145,224 B2 * | 12/2006 | Kawashima et al. | 257/678 |
| 2004/0262720 A1 * | 12/2004 | Satou et al. | 257/676 |
| 2007/0132075 A1 * | 6/2007 | Masumoto | 257/676 |

* cited by examiner

*Primary Examiner* — Wael M Fahmy
*Assistant Examiner* — Marc Armand
(74) *Attorney, Agent, or Firm* — Kilpatrick Townsend & Stockton LLP (57) ABSTRACT

A multi-chip module suitable for use in a battery protection circuit. The multi-chip module includes an integrated circuit chip, a first power transistor, a second power transistor, a first connection structure electrically coupling the integrated circuit chip to the first power transistor, a second connection structure electrically coupling the integrated circuit chip to the second power transistor, and a leadframe structure comprising a first lead, a second lead, a third lead and a fourth lead, wherein the integrated circuit chip, the first power transistor, and the second power transistor are mounted on the leadframe structure. A molding material covers at least part of the integrated circuit chip, the first power transistor, the second power transistor, the first connection structure, and the second connection structure.

5 Claims, 9 Drawing Sheets

MULTI-CHIP MODULE FOR BATTERY POWER CONTROL

CROSS-REFERENCES TO RELATED APPLICATIONS

This Application is a Divisional of U.S. patent application Ser. No. 11/672,728, filed Feb. 8, 2007, which claims priority to U.S. Provisional Patent Application No. 60/773,034, filed on Feb. 13, 2006. Both of the above-identified applications and their contents are incorporated herein by reference in their entirety for all purposes.

BACKGROUND

Various protection mechanisms for lithium ion batteries exist. If a lithium ion battery overcharges, strong exothermic reactions are possible and the potential for causing a fire increases.

Figure 1:
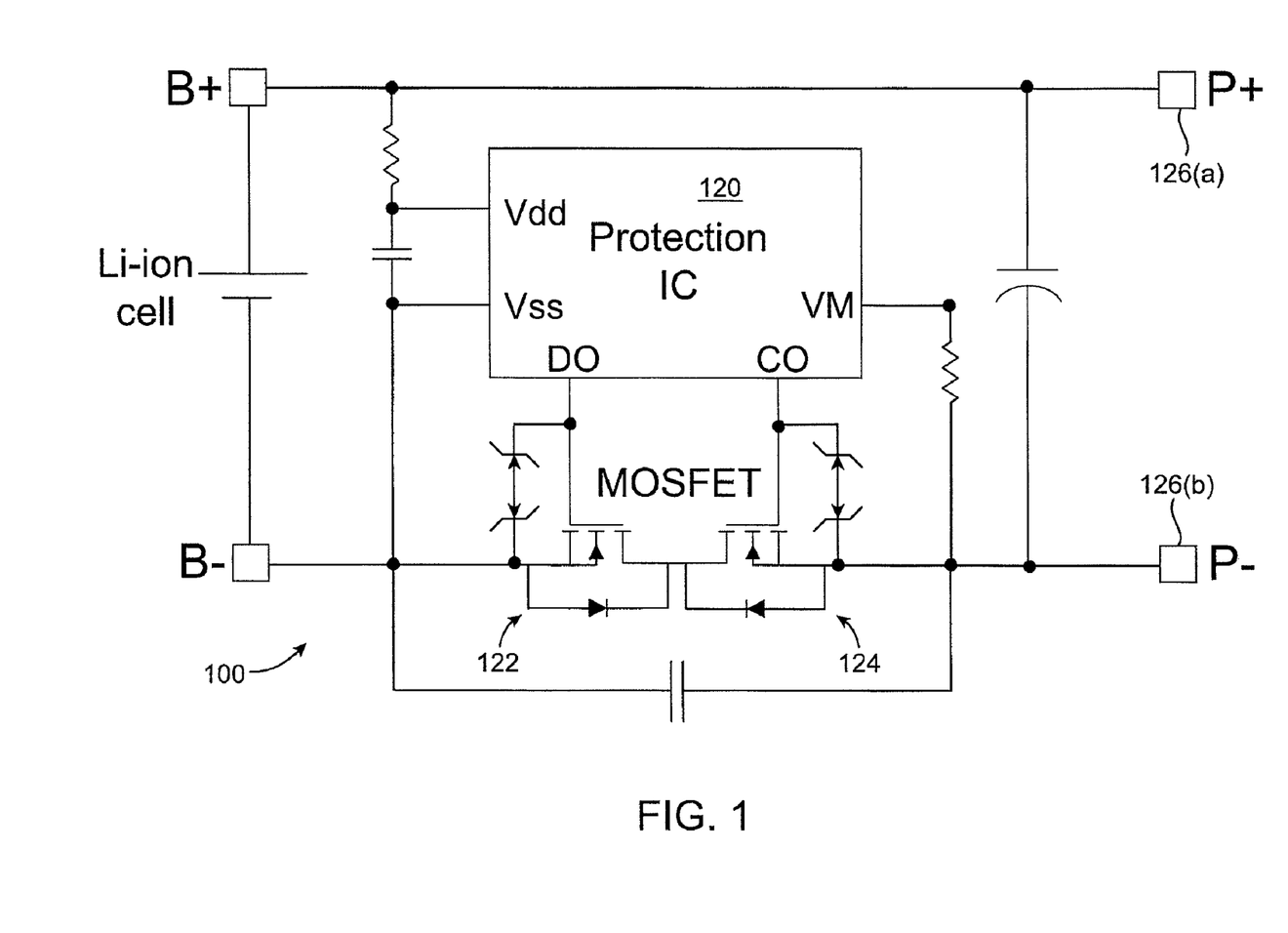
FIG. 1 shows a conventional battery protection circuit diagram.

To prevent a lithium ion battery from overcharging, a battery protection circuit is used. The battery protection circuit, an example of which is shown in FIG. 1, often contains, among other components, two FET (field effect transistor) switches 122, 124 and a control IC (integrated circuit) 120. One FET prevents current from flowing into the battery, while the other prevents current from flowing from the battery unless the control IC enables it.

Multi-chip modules containing control ICs and MOSFETs exist. However, a number of improvements could be made. For example, some conventional multi-chip modules contain leads on all four sides of the packages. This results in larger modules, which is undesirable, because such modules are used in small electronic devices such as cell phones. The sizes of the multi-chip modules can be reduced, but this reduces the current carrying capacity of the chips that can be used in such packages.

Thus, improved multi-chip modules are needed.

Embodiments of the invention address the above problems and other problems, individually and collectively.

BRIEF SUMMARY

Embodiments of the invention are directed to multi-chip modules, methods for making multi-chip modules, as well systems and assemblies incorporating the multi-chip modules.

One embodiment of the invention is directed to a multi-chip module comprising at least one integrated circuit (IC) chip, at least one power device chip, and a metal leadframe structure including leads. The metal leadframe structure comprises at least two independent die mounting pads electrically isolated from one another. The at least two independent die mounting pads include a first pad for mounting at least one IC chip and a second pad for mounting at least one power device chip. The multi-chip module may also comprise bonding wires having more than one diameter connecting the at least one IC chip and the at least one power device chip to the leads.

Another embodiment of the invention is directed to a battery protection module comprising an integrated circuit chip and at least one power device chip housed in a single housing for regulating the charging and discharging of a battery. The housing may be formed from a molding material. The integrated circuit chip and the at least one power device chip form at least part of a circuit. Required external connections to the circuit are limited to four leads.

Another embodiment of the invention is directed to a multi-chip module comprising an integrated circuit chip, a first power transistor, a second power transistor, a first connection structure electrically coupling the integrated circuit chip to the first power transistor, a second connection structure electrically coupling the integrated circuit chip to the second power transistor, and a leadframe structure. The leadframe structure comprises a first lead, a second lead, a third lead and a fourth lead, wherein the integrated circuit chip, the first power transistor, and the second power transistor are mounted on the leadframe structure. A molding material covers at least part of the integrated circuit chip, the first power transistor, the second power transistor, the first connection structure, and the second connection structure. The first lead provides an electrical connection to the first power transistor and the second lead provides an electrical connection to the second power transistor. The first and second leads are at a first end of the multi-chip module, and the third and fourth leads are at a second end of the multi-chip module. At least one of the die mounting pads has no external leads, mounting pads, or other die mounting pads along both of two opposite sides of the pad.

Other embodiments of the invention are directed to methods for forming the above-described multi-chip modules, as well as assemblies and systems using such modules.

Other embodiments of the invention can be described with reference to the Figures and the Detailed Description below.

BRIEF DESCRIPTION OF THE DRAWINGS

FIGS. 4(a)-4(e) illustrate a process flow for making the multi-chip module shown in FIG. 2.

DETAILED DESCRIPTION

The integration of a power semiconductor switch and a control IC for regulating the charging of a battery such as a cell phone battery is disclosed. In embodiments of the invention, a small form factor multi-chip module is disclosed and it can be mounted onto a miniature circuit board. The miniature circuit board can be connected to a terminal end of a battery pack. The multi-chip module may form part of a battery protection circuit.

As noted above, FIG. 1 shows a conventional battery protection circuit. Some have used discrete components to create the circuit shown in FIG. 1. When many discrete components are used to form the circuit shown in FIG. 1, the formed protection circuit may end up occupying a relatively large amount of space. For example, a minimum of eight solder pads may be required on the circuit board just for the discrete IC and power MOSFETs.

Embodiments of the invention focus on maximizing the chip area encapsulated inside of a compact (for example, 2 mm×5 mm) housing of a multi-chip module. The number of external pins in the multi-chip module and the internal signal routing features are minimized inside of the housing.

A number of different features can lead to a compact, multi-chip module of this type. First, the die mounting pad of the leadframe structure for the power MOSFET can extend completely from one edge of the multi-chip module to the other. This allows the size of a power chip on the die mounting pad to be maximized, thereby maximizing the current rating of the power MOSFET. Second, there are no "down bonds" from either the power chip or the IC chip to the leadframe structure. Third, connections between the IC and the power MOSFET are made by chip-to-chip interconnects (e.g., wire interconnects). Fourth, the number of external leads and signal routing elements adjacent to the MOSFET die mounting pad is minimized. By minimizing the external leads and eliminating "down bonds", the area inside the package is maximized allowing for a larger power MOSFET. The increased size of the power MOSFET reduces on-resistance which minimizes power loss and reduces heating. This ultimately increases the useful energy of the battery.

The multi-chip modules according to embodiments of the invention may also have a special diagnostic test mode. To prevent current overshoot, the MOSFET switching time is slowed down by the driver IC. Normal operating mode validation testing would need 1200 ms of test time in embodiments of the invention. One lead of the multi-chip module, which is not used for normal operation, connects to a pad on the IC that enables the IC to scale the switching time by a factor of 10 thus allowing the validation test time to be reduced to 120 ms. The reduced test time increases the throughput of the validation test operation and reduces the manufacturing cost of the product. In embodiments of the invention, an optional fifth lead in the multi-chip module beside the IC mounting pad can function exclusively to set the IC to the special diagnostic test mode.

Figure 2:
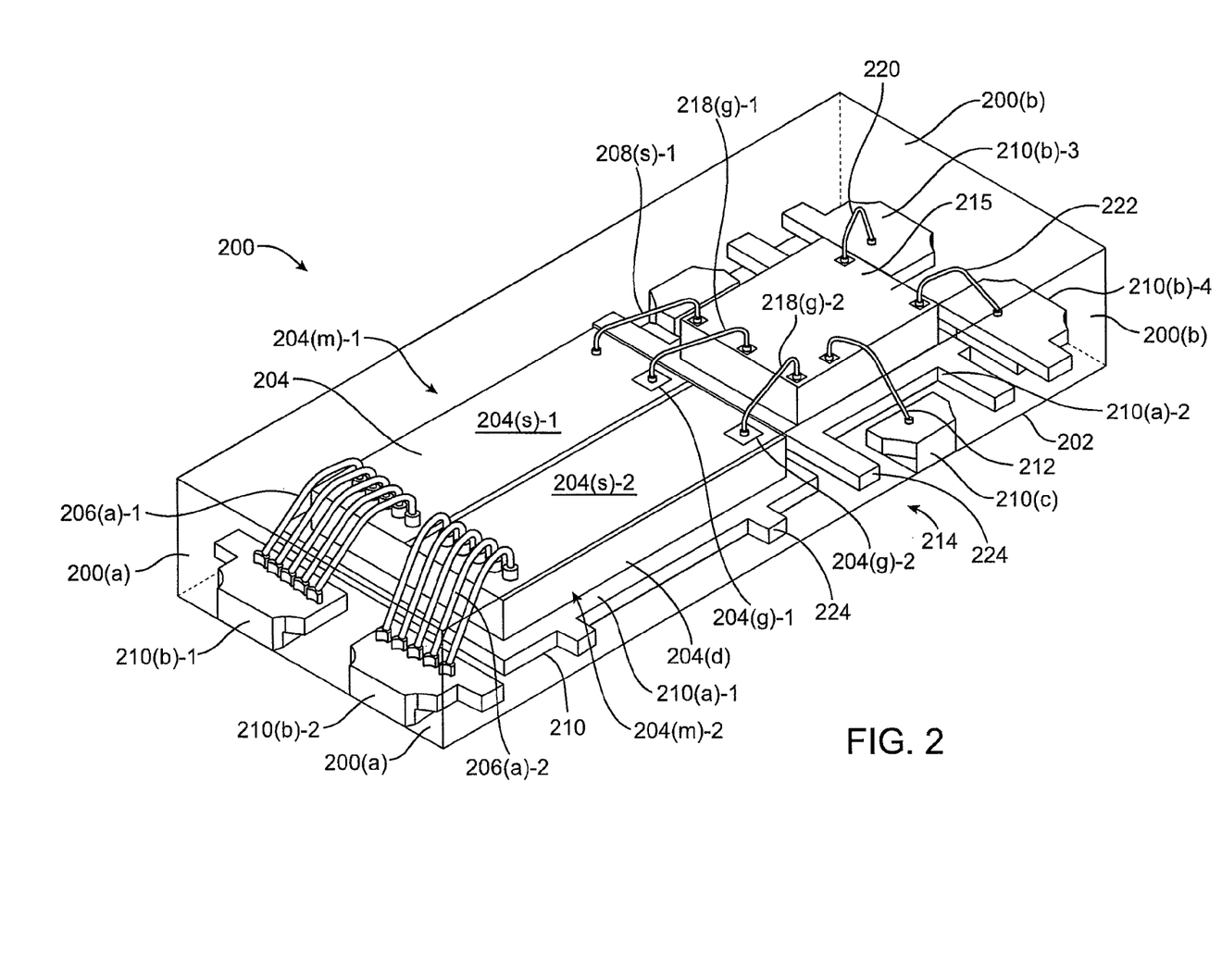
FIG. 2 shows a perspective view of a multi-chip module according to an embodiment of the invention. Inner components in the multi-chip module are also shown.

FIG. 2 shows a multi-chip module 200 according to an embodiment of the invention. As shown in FIG. 2, the multi-chip module 200 comprises an elongated shape and includes a first longitudinal end 200(a) and a second opposite longitudinal end 200(b). The multichip module 200 may have an aspect ratio greater than 1 in embodiments of the invention. As will be explained in further detail below, this particular form factor minimizes space when it is used in an electrical assembly that is used with a rechargeable battery.

The multi-chip module 200 comprises a leadframe structure 210. The leadframe structure 210 in this example comprises a first mounting pad 210(a)-1 and a second mounting pad 210(a)-2, which are separated from each other by a gap 214. The gap 214 electrically isolates the first and second mounting pads 210(a)-1, 210(a)-2, so that any chips that are on those pads are not directly electrically connected together through the leadframe structure 210.

In other embodiments, the gap 214 need not be present. For example, it would be possible to have a single mounting pad, and then have a dielectric layer under one or both of any chips mounted on the single mounting pad. The dielectric layer would then electrically isolate the bottom surfaces of the chips from each other.

The leadframe structure 210 also comprises tie bars 224. (Reference number 224 points to examples of tie bars; in this specific example, there are 6 tie bars on one side of the package and 12 tie bars total in the package.) The tie bars 224 extend laterally away from the first and second die mounting pads 210(a)-1, 210(a)-2. These tie bars 224 can be used to connect many leadframe structures together in an array of leadframe structures during processing.

As shown in FIG. 2, the leadframe structure 210 also includes two leads 210(b)-1, 210(b)-2 (e.g., first and second leads) at one longitudinal end of the leadframe structure 210 and at one longitudinal end of the module 200. The leadframe structure 210 also comprises two leads 210(b)-3, 210(b)-4 (e.g., third and fourth leads) at the other longitudinal end of leadframe structure 210 and the module 200. An optional test lead 210(c) is laterally disposed with respect to the second mounting pad 210(a)-2. As shown in FIG. 2, there are only four necessary leads 210(b)-1, 210(b)-2, 210(b)-3, 210(b)-4 in the module 200.

In this example, the leads 210(b)-1, 210(b)-2, 210(b)-3, 210(b)-4 are separated from the first and second die mounting pads 210(a)-1, 210(a)-2, but they could be connected to them (e.g., integral with them) if the module 200 is used in a different type of circuit.

The leadframe structure 210 may comprise any suitable material including copper, and alloys thereof. In some embodiments, the leadframe structure 210 may be pre-plated with NiPdAu or plated with a solderable material (e.g., Sn).

The semiconductor chip 204 comprises power transistors and is mounted on the first mounting pad 210(a)-1. A control IC chip 215 is mounted on the second die mounting pad 210(a)-2.

In this embodiment, the semiconductor chip 204 comprising the power transistors comprises a first MOSFET 204(m)-1 comprising a first source region 204(s)-1 and a first gate region 204(g)-1 at a first surface of the chip 204, and a drain region 204(d) at a second surface of the chip 204. The first MOSFET would be a vertical MOSFET in this example, because source region 204(s)-1 and the drain region 204(d) are at opposite sides of the chip 204. In this example, the first surface of the chip 204 would be distal to the leadframe structure 210 while the second surface of the chip 204 would be proximate to the leadframe structure 210.

While power MOSFETs are described in detail, any suitable vertical power transistor can be used in embodiments of the invention. Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

The semiconductor chip 204 also comprises a second MOSFET 204(m)-2 comprising a second source region 204(s)-2 and a second gate region 204(g)-2 at the first surface of the chip 204. The second MOSFET 204(m)-2 also includes a drain region 204(d) at the second surface of the chip 204. In this example, the first and second MOSFETs 204(m)-1, 204(m)-2 share a common substrate that is a common drain. (In FIG. 2, the diffusion regions defining areas such as source regions in the chip 204 are not illustrated.) The drain region 204(d) of the first and second MOSFETs 204(m)-1, 204(m)-2 may be electrically coupled to the mounting pad 210(a)-1.

In the specific example shown in FIG. 2, two MOSFETs are present in a single chip. However, in other embodiments, there could only be one MOSFET in the chip 204, or two separate chips could be mounted on the first die mounting pad 210(a). In addition, although two MOSFETs are shown, it may be possible to use only one MOSFET in other embodiments if the end application is different than the battery protection circuit shown in FIG. 1.

A number of connection structures may be used to electrically couple the chips together, and/or electrically couple the chips to leads. Examples of connection structures include wires or conductive clips. Such connection structures may comprise any suitable material including noble metals such as gold, or metals such as copper or alloys thereof. In the multi-chip module 200 shown in FIG. 2, the connection structures are in the form of wires.

Referring to FIG. 2, a plurality of wires 206(a)-1, 206(a)-2 of a first diameter electrically couple the source regions 204(s)-1, 204(s)-2 of the MOSFETs to the leads 210(b)-1, 210(b)-2. Wires 220, 222 of a second diameter may electrically couple the IC chip 215 to the leads 210(b)-3, 210(b)-4. The wires 206(a)-1, 206(a)-2 connected to the source regions 204(s)-1, 204(s)-2 have larger diameters than the wires 220, 222 connected to the IC chip 215, because the former carry more current than the latter.

Additional wires that may be present in the multi-chip module 200 include wires 218(g)-1, 218(g)-2, which connect the IC chip 215 to the gate regions 204(g)-1, 204(g)-2. Another wire 208(s)-1 electrically couples the IC chip 215 to the source region 204(s)-1 of one of the MOSFETs in the chip 204. Yet another wire 212 electrically couples the test lead 210(c) to the IC chip 215.

The molding material 202 covers at least a portion of the leadframe structure 210, the power transistor chip 204, and the IC chip 215. The molding material 202 may comprise an epoxy material or any other suitable material. As shown in FIG. 2, the terminal ends of the leads 210(b)-1, 210(b)-2, 210(b)-3, 210(b)-4 do not extend past the lateral surfaces of the molding material 202. The multi-chip module 200 shown in FIG. 2 may be characterized as a MLP (microlead package) type package.

In the multi-chip module 200 in FIG. 2, there are no "down bonds" or wire bonds down to the mounting pad 210(a)-1. For example, a wire 208(s)-1 is used to connect the IC chip 215 to the source region 204(s)-1 of the first MOSFET 204(m)-1 in the chip 204 via the top surfaces of the chips 204, 215. Because no "down bond" is present in the multi-chip module 200, space that would otherwise be used for the down bond can be occupied by the chip 204, thus maximizing the size of the chip 204 within the boundaries of the multi-chip module 200.

The multi-chip module 200 may also include an optional dedicated test lead 210(c). The package can be tested more rapidly with the test lead 210(c). Using the test lead 210(c), the IC chip 215 can be reprogrammed so that testing can be performed more quickly. As explained above, with this feature, testing can occur up to 10 times faster than it would without the dedicated test lead 210(c).

Figure 3:
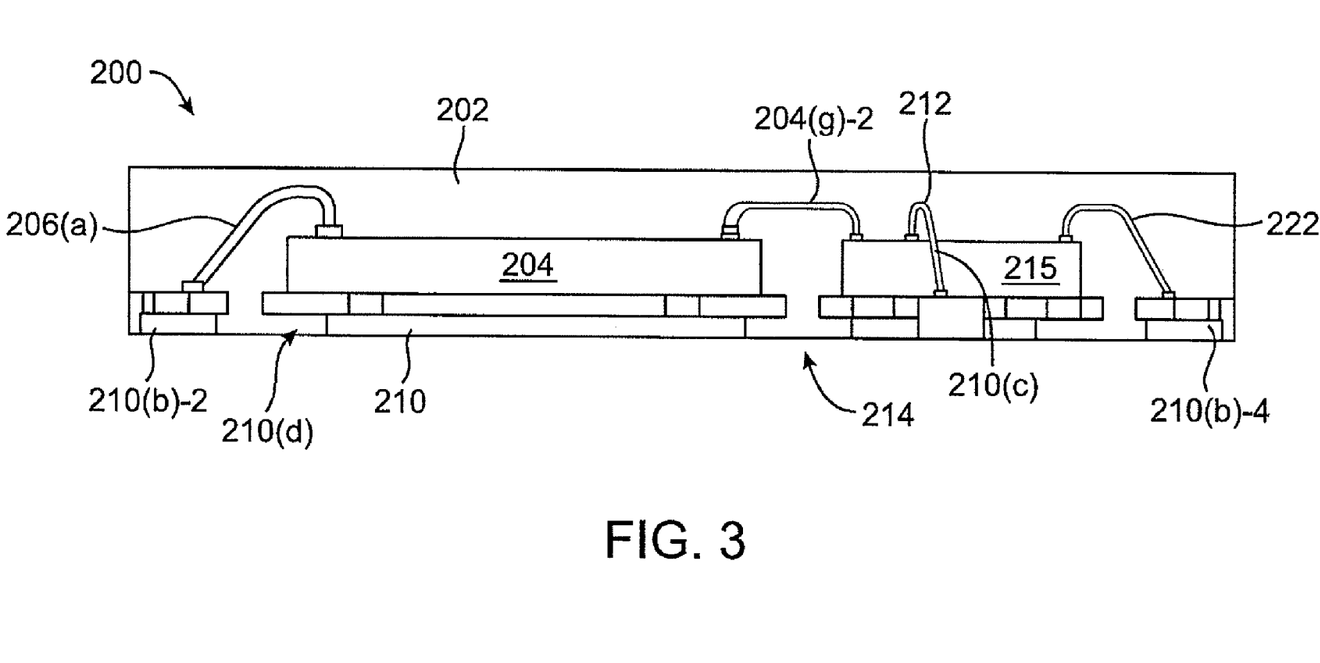
FIG. 3 shows a side view of the module shown in FIG. 2.

FIG. 3 shows a side view of the module shown in FIG. 2. The components in FIG. 3 are described with respect to FIG. 2, and like numerals designate like elements. FIG. 3 additionally shows a partially etched region 210(d) (e.g., half-etched region) of the leadframe structure 210. The molding material 202 fills the space formed by the half-etched region 210(d) and the molding material 202 can lock the leadframe structure 210 into place. Wet etching process may be used to form the partially etched regions 210(a) as is common in the art.

FIG. 3 also shows that the bottom, exterior surface of the leadframe structure 210 may be substantially coplanar with the exterior surface of the molding material 202. The multi-chip module 200 may be directly mounted to a circuit board or the like, and the exposed surface of the leadframe structure 210 may serve to transfer heat from the power chip 204 to an underlying pad on a circuit board (not shown).

A method for forming the module 200 can be described with reference to FIGS. 4(a)-4(e).

Figure 4A:
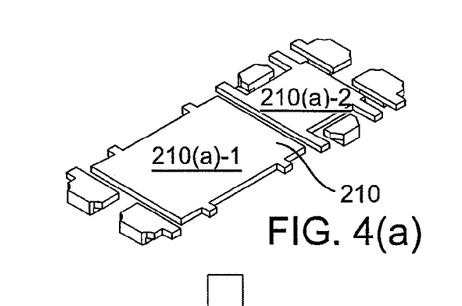
FIGS. 4(a)-4(e) show perspective views of components in the multi-chip module.

FIG. 4(a) shows a leadframe structure 210 including a first die mounting pad 210(a)-1 and a second die mounting pad 210(a)-2. This leadframe structure 210 may be obtained in any suitable manner including etching, stamping, etc.

Figure 4B:
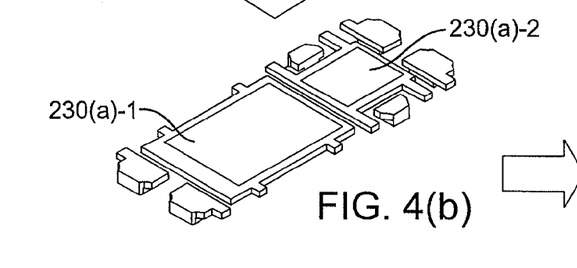

As shown in FIG. 4(b), a conductive material 230(a)-1, 230(a)-2 such as silver loaded epoxy or solder material (lead or lead-free) is then applied to the first and second die mounting pads 210(a)-1, 210(a)-2, respectively. The conductive adhesive 230(a)-1, 230(a)-2 may be applied to the first and second die mounting pads 210(a)-1, 210(a)-2 by a coating process or dispensing process. The adhesive may also be non-electrically conducting in other embodiments.

Figure 4C:
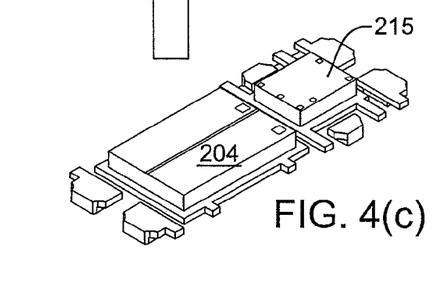

As shown in FIG. 4(c), the chips 204, 215 are then attached to the first and second die mounting pads 210(a)-1, 210(a)-2. Any suitable process including a pick and place process may be used to mount the chips 204, 215 onto the mounting pads 210(a)-1, 210(a)-2.

Figure 4D:
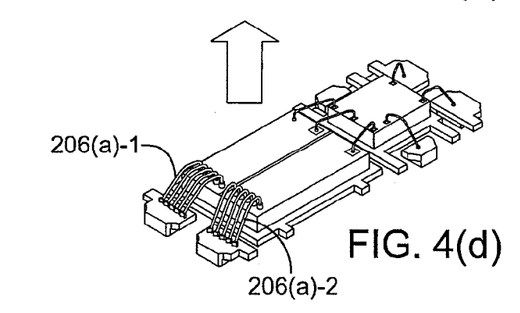

As shown in FIG. 4(d), the previously described wires (e.g., including wires 206(a)-1, 206(a)-2) are bonded to the chips 204, 215 as well as the leads in the leadframe structures 210 as previously described. Suitable wire-bonding processes (e.g., ultrasonic bonding) are known to those of ordinary skill in the art.

Figure 4E:
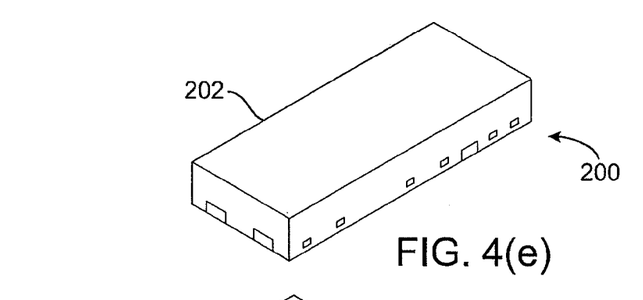

As shown in FIG. 4(e), a molding material 202 is then formed around at least a portion of the leadframe structure 210, the chips 204, 215, and the various wires (e.g., 206(a)-1, 206(a)-2) using a conventional molding process.

Figure 5:
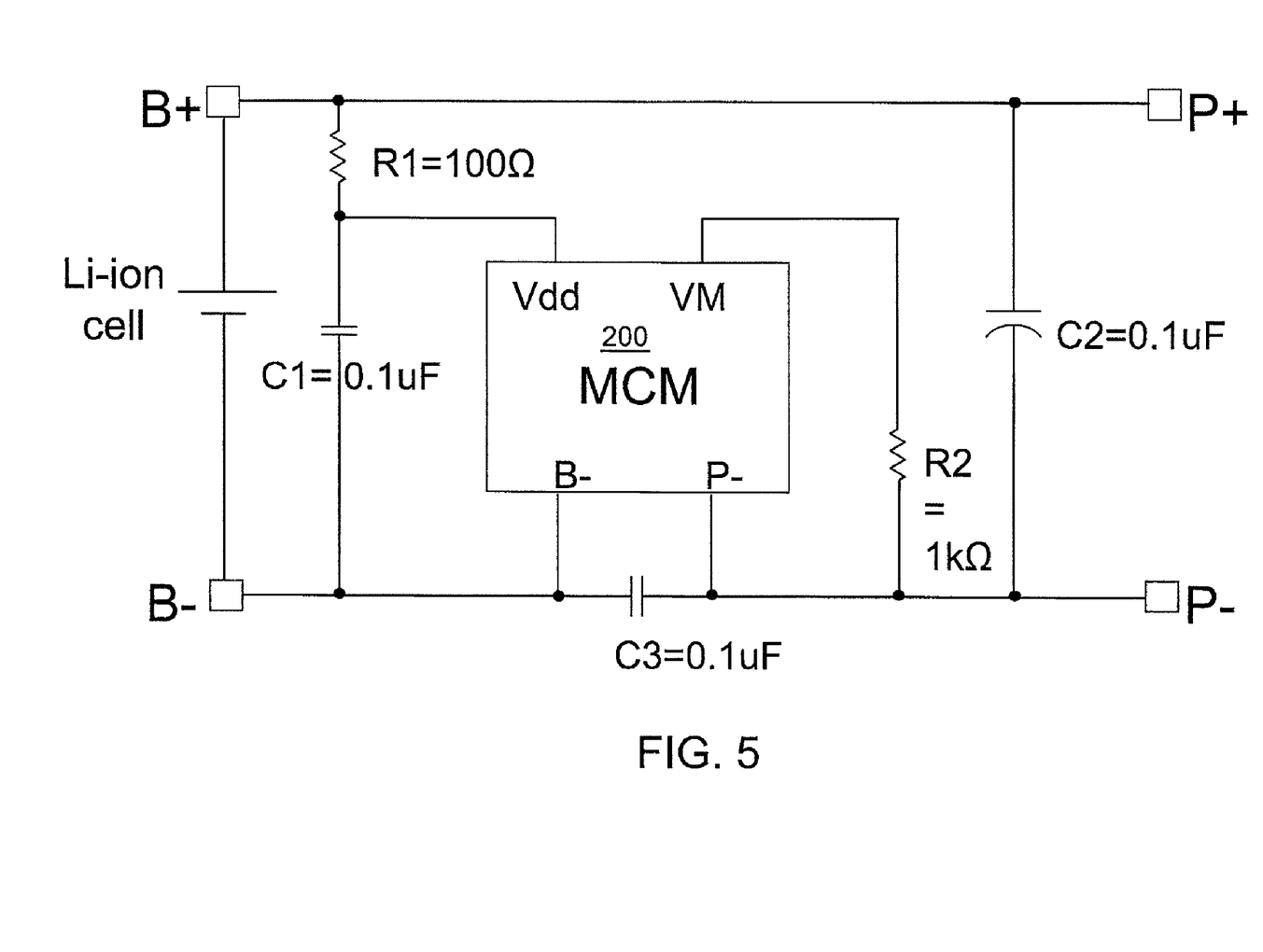
FIG. 5 shows a battery protection circuit diagram incorporating the multi-chip module shown in FIG. 2.

FIG. 5 shows a circuit diagram incorporating the previously described multi-chip module 200. Referring to both FIGS. 2 and 5, B-corresponds to lead 210(b)-1, P-corresponds to lead 210(b)-2, Vdd corresponds to lead 210(b)-3, and VM corresponds to lead 210(b)-4. The multi-chip module 200 in FIG. 5 advantageously incorporates many of the electronic components in the diagram in FIG. 1. The multi-chip module 200 makes it easier to form the battery protection circuit, since many of the components of the circuit are present in a single, small form factor module.

Figure 6:
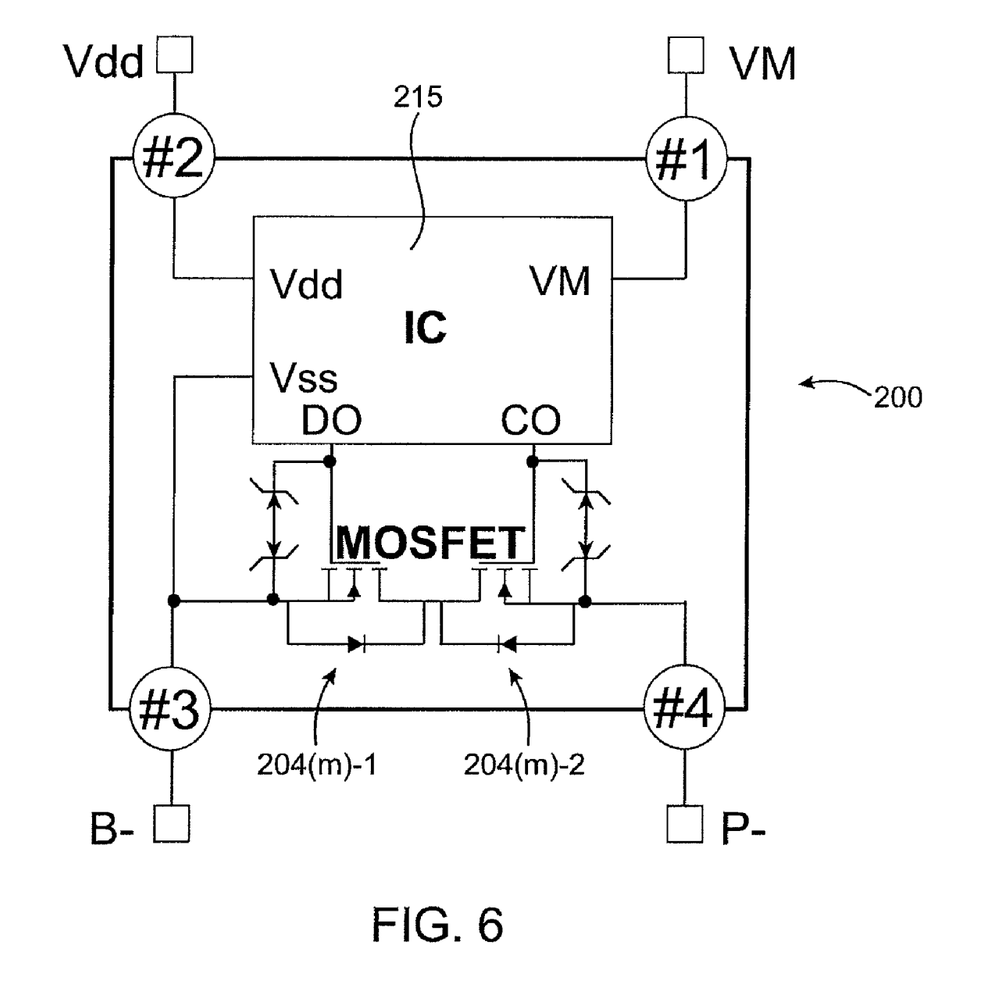
FIG. 6 shows a circuit diagram for the multi-chip module shown in FIG. 2.

FIG. 6 shows the inside circuit diagram of the components of the module 200. In FIG. 6, there is an IC chip 215, and two MOSFETs 204(m)-1, 204(m)-2 which are controlled by the IC chip 215. Referring to FIGS. 2 and 6, IC chip terminal Vss may connect to wire 208(s)-1, terminal DO may connect to wire 218(g)-1, terminal VM may connect to wire 222, and terminal CO may connect to 218(g)-2. It is also easier to mount the module 200 to a circuit board than it is to mount many discrete components to a circuit board.

Figure 7:
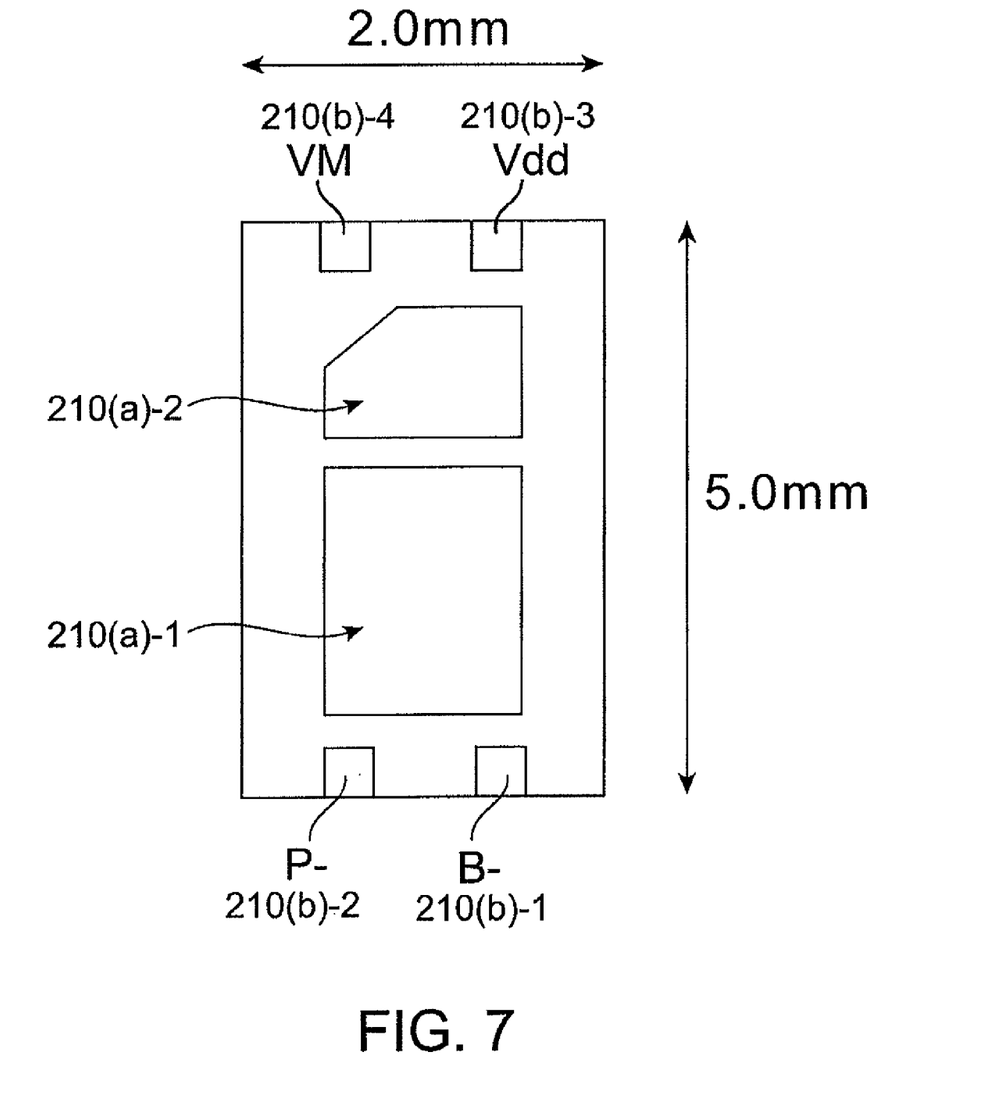
FIG. 7 shows a bottom view of a multi-chip module.

FIG. 7 shows a bottom view of the module 200. In this Figure, the previously described test lead is not shown. As shown in FIG. 7, the bottom surface of the module 200 includes exposed surfaces of the die mounting pads 210(a)-1, 210(a)-2 as well as exposed surfaces of the leads 210(b)-1, 210(b)-2, 210(b)-3, 210(b)-4. As shown, the exterior surface of the molding material 202 is substantially coplanar with the exposed exterior surfaces of the leads 210(b)-1, 210(b)-2, 210(b)-3, 210(b)-4 and the die mounting pads 210(a)-1, 210

(a)-2. As shown, one dimension may be about 2.0 mm and another longitudinal dimension may be about 5.0 mm in length. The module in this example has an aspect ratio greater than about 2.

Figure 8:
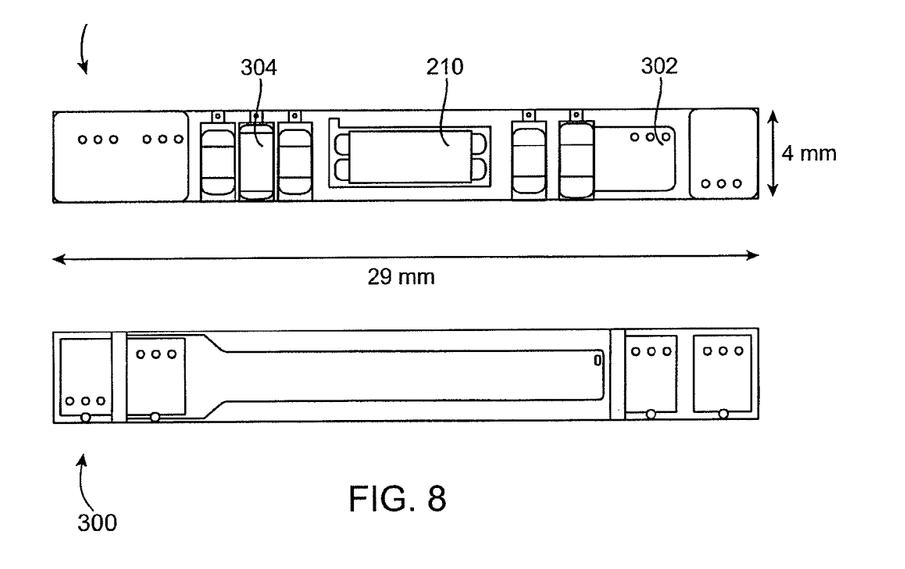
FIG. 8 shows an electrical assembly including a circuit substrate and the multi-chip module shown in FIG. 2 mounted on the circuit substrate.

FIG. 8 shows an electrical assembly 300 comprising a circuit board 302 with the module 200 mounted to it. Other electrical components 304 could also be mounted to the circuit board 302.

Figure 9:
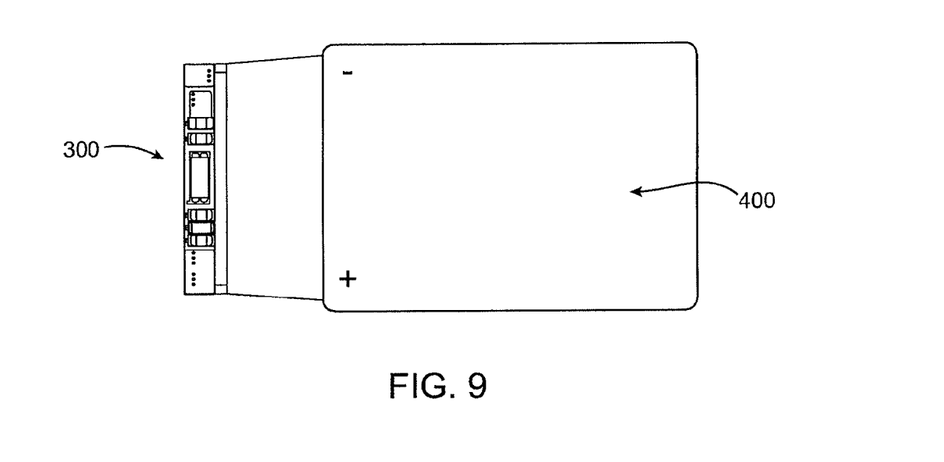
FIG. 9 shows a system including a lithium ion battery coupled to the electrical assembly shown in FIG. 8.

FIG. 9 shows a system comprising the previously described electrical assembly 300 connected to a lithium ion battery 400. As shown in FIGS. 8 and 9, the particular form factor of the module 200 allows the battery protection circuit that is used with the lithium ion battery 400 to be compact.

Figure 10A:
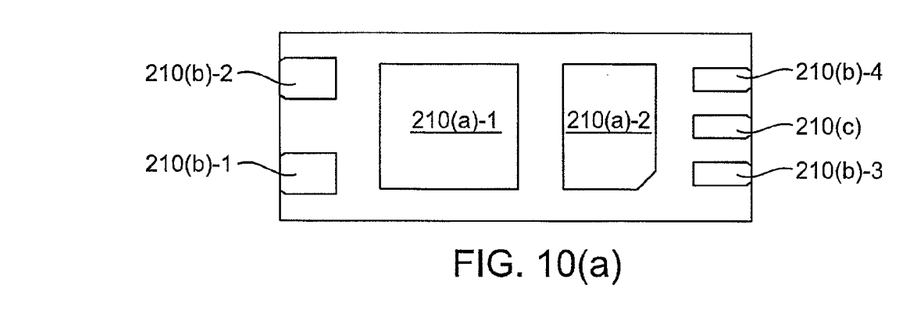
FIG. 10(a) shows a bottom plan view of another module embodiment.
Figure 10B:
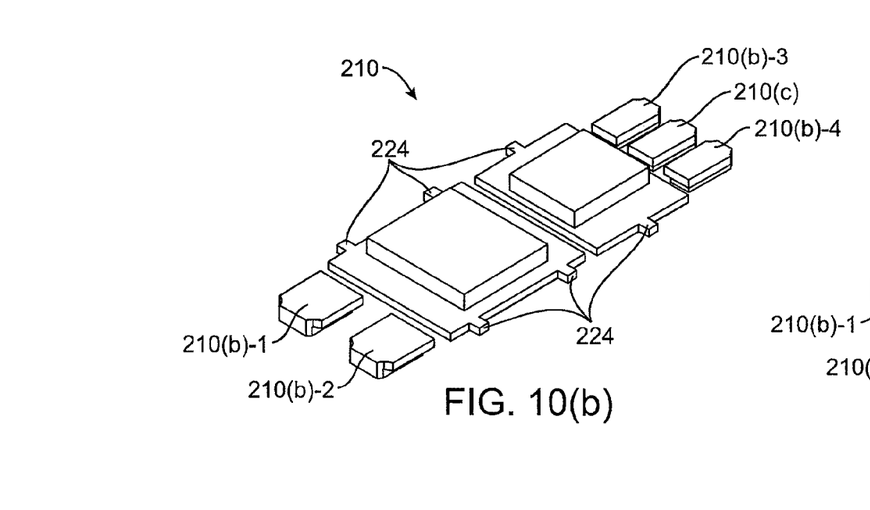
FIG. 10(b) shows a top bottom perspective view of the leadframe structure and the die used in the module in FIG. 10(a).
Figure 10C:
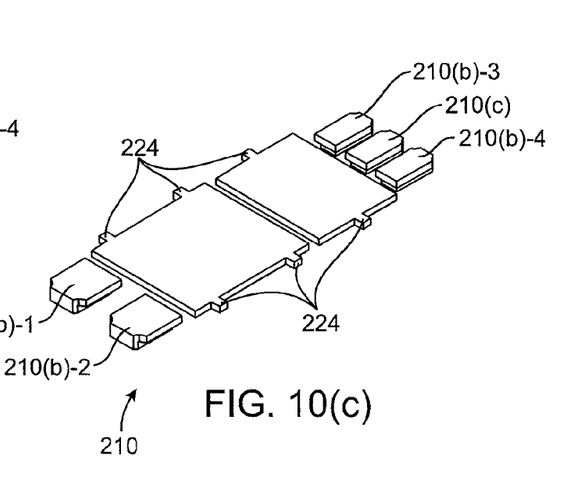
FIG. 10(c) shows a top perspective view of the leadframe structure shown in FIG. 10(b).

FIG. 10(a) shows a bottom plan view of another module embodiment. FIG. 10(b) shows a top perspective view of the leadframe structure and the die used in the module in FIG. 10(a). FIG. 10(c) shows a top perspective view of the leadframe structure shown in FIG. 10(b). In FIGS. 10(a)-10(c), many of the reference numerals are already described above.

The embodiment in FIG. 10(a) can be similar to the embodiments described above with respect to FIGS. 2-4. However, in this embodiment, the module has a test lead 210(c) at an end of the module, rather than at a side of the module (e.g., as in FIG. 2). In this example, the test lead 210(c) is between leads 210(b)-3 and 210(b)-4. Also, as shown in FIGS. 10(b) and 10(c), the leadframe structure 210 can have fewer tie bars 224 than the leadframe structure 210 described above with reference to FIGS. 2-4 (e.g., 3 tie bars per side, instead of 6 tie bars per side). These changes can help to reduce mechanical stress during sawing (as compared to the embodiments described with reference to FIGS. 2-4). Also, by providing the test lead 210(c) at an end of the module, the second mounting pad 210(a)-2 can be wider and can accommodate a larger IC chip.

In addition, the leads 210(b)-1, 210(b)-2, 210(b)-3, 210(b)-4 are slightly longer in the leadframe structure 210 in FIGS. 10(b)-10(c), as compared to the leadframe structure 210 in FIGS. 2-4. By using longer leads, the sizes of the solder joints that are between the module and circuit board can be increased.

The multi-chip modules according to embodiments of the invention could be used in various systems wireless phone systems, laptop computers, server computers, power supplies, etc.

Any recitation of "a", "an" or "the" is intended to mean "one or more" unless specifically indicated to the contrary.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

What is claimed is:

1. A method comprising:
   obtaining a leadframe structure comprising a first lead, a second lead, a third lead and a fourth lead;
   mounting an integrated circuit chip to the leadframe structure;
   mounting at least one semiconductor chip comprising a first power transistor and a second power transistor on the leadframe structure;
   attaching a first connection structure to the integrated circuit chip and to the first power transistor;
   attaching a second connection structure to the integrated circuit chip and to the second power transistor;
   attaching a third connection structure to the integrated circuit chip and to the third lead;
   attaching a fourth connection structure to the integrated circuit chip and to the fourth lead, the fourth lead being separate from the third lead; and
   molding a material around at least part of the integrated circuit chip, the first power transistor, the second power transistor, the first connection structure, and the second connection structure, thereby forming a multichip module,
   wherein the first lead provides an electrical connection to the first power transistor and the second lead provides an electrical connection to the second power transistor, and
   wherein the first and second leads are at a first end of the multi-chip module, and the third and fourth leads are at a second end of the multi-chip module, the second end being opposite to the first end.

2. The method of claim 1 wherein the leadframe structure further comprises a test lead, and wherein the method further comprises:
   attaching a fifth connection structure to the integrated circuit chip and to the test lead.

3. The method of claim 1 further comprising:
   mounting the multi-chip module to a circuit board.

4. A method comprising:
   obtaining a metal leadframe structure including a first lead, a second lead, a third lead, a fourth lead, and at least two independent die mounting pads electrically isolated from one another, the at least two independent die mounting pads including a first pad for mounting at least one integrated circuit chip and a second pad for mounting at least one transistor device chip;
   mounting the at least one integrated circuit chip to the first pad;
   mounting a first MOSFET transistor and a second MOSFET transistor on the second pad, the first MOSFET transistor having a gate electrode, a source electrode, and a drain electrode, the first MOSFET transistor being mounted so that its drain electrode faces the second pad and is electrically coupled to the second pad, the second MOSFET transistor having a gate electrode, a source electrode, and a drain electrode, the second MOSFET transistor being mounted so that its drain electrode faces the second pad and is electrically coupled to the second pad;
   attaching a first plurality of bonding wires that connect the integrated circuit chip to the first and second leads and to at least the gate electrodes of the first and second MOSFET transistors, the first plurality of bonding wires having a first diameter;
   attaching a second plurality of bonding wires that connect the source electrodes of the first and second MOSFET transistors to the third and fourth leads, respectively, the second plurality of bonding wires having a second diameter that is greater than the first diameter; and
   molding a molding material around at least a portion of the metal leadframe structure, the at least one IC chip, the first MOSFET transistor, the second MOSFET transistor, and the bonding wires to define at least a front surface and a back surface of the module; wherein the mounting pads of the leadframe structure are exposed on the back surface of the module.

5. The method of claim 4, wherein the module includes an epoxy molding material.

* * * * *

UNITED STATES PATENT AND TRADEMARK OFFICE
CERTIFICATE OF CORRECTION

PATENT NO.      : 8,003,447 B2                        Page 1 of 1
APPLICATION NO. : 12/964691
DATED           : August 23, 2011
INVENTOR(S)     : Jeongil Lee et al.

It is certified that error appears in the above-identified patent and that said Letters Patent is hereby corrected as shown below:

In Claim 1, column 8, line 16, after the first occurrence of the word "second" insert --end--.

In Claim 4, column 8, line 50, after "diameter;" insert --and--.

In Claim 4, column 8, line 55, delete "and".

Signed and Sealed this
Eighth Day of November, 2011

David J. Kappos
*Director of the United States Patent and Trademark Office*